United States Patent
Frye et al.

(10) Patent No.: US 10,103,537 B2
(45) Date of Patent: Oct. 16, 2018

(54) GROUND FAULT DETECTION AND INTERRUPT SYSTEM

(71) Applicant: GE Energy Power Conversion Technology Ltd, Rugby, Warwickshire (GB)

(72) Inventors: David Everett Frye, Pittsburgh, PA (US); Philip Edgar Crapse Stone, Pittsburgh, PA (US); Daniel Francis Opila, Pittsburgh, PA (US); Robert Gregory Wagoner, Salem, VA (US); Siddharth Pant, Pittsburgh, PA (US); Shrutish Dawande, Pittsburgh, PA (US)

(73) Assignee: GE ENERGY POWER CONVERSION TECHNOLOGY LTD, Rugby, Warwickshire (GB)

( * ) Notice: Subject to any disclaimer, the term of this patent is extended or adjusted under 35 U.S.C. 154(b) by 268 days.

(21) Appl. No.: 14/971,208

(22) Filed: Dec. 16, 2015

(65) Prior Publication Data

US 2017/0179708 A1 Jun. 22, 2017

(51) Int. Cl.
*H02H 5/04* (2006.01)
*G01K 7/00* (2006.01)
*H03K 17/56* (2006.01)

(52) U.S. Cl.
CPC .............. *H02H 5/047* (2013.01); *G01K 7/00* (2013.01); *H03K 17/56* (2013.01)

(58) Field of Classification Search
CPC ........... H92H 3/16; H02H 3/162; H02H 3/33; H02H 1/0015
USPC ........................................................ 361/42
See application file for complete search history.

(56) References Cited

U.S. PATENT DOCUMENTS

| | | |
|---|---|---|
| 8,134,812 B2 | 3/2012 | Gilmore et al. |
| 8,179,147 B2 | 5/2012 | Dargatz et al. |
| 8,446,042 B2 | 5/2013 | Bundschuh et al. |
| 8,446,043 B1 | 5/2013 | Bundschuh et al. |
| 8,461,718 B2 | 6/2013 | Bundschuh et al. |
| 8,471,408 B2 | 6/2013 | Bundschuh et al. |
| 8,547,669 B2 | 10/2013 | Larson et al. |
| 8,564,916 B2 | 10/2013 | Kazemi et al. |

(Continued)

FOREIGN PATENT DOCUMENTS

| | | |
|---|---|---|
| EP | 2541611 A1 | 1/2013 |
| WO | 2012026449 A1 | 3/2012 |

(Continued)

OTHER PUBLICATIONS

International Search Report and Written Opinion issued in connection with corresponding PCT Application No. PCT/EP2016/080740 dated Mar. 23, 2017.

*Primary Examiner* — Dharti Patel
(74) *Attorney, Agent, or Firm* — GE Global Patent Operation; Scott R. Stanley

(57) ABSTRACT

Provided is a fault isolation apparatus for an inverter configured for coupling to an external power supply. The apparatus includes a plurality of fault detection devices, each configured to (i) complete an electrical path between the inverter and the external power supply and (ii) detect a fault along its respective electrical path. The apparatus also includes a controller configured to instruct the fault detection device to complete its respective electrical path only when the path is devoid of the detected fault.

19 Claims, 4 Drawing Sheets

(56) References Cited

U.S. PATENT DOCUMENTS

| | | |
|---|---|---|
| 8,735,714 B1 | 5/2014 | Lagree |
| 8,878,563 B2 | 11/2014 | Robbins |
| 8,891,211 B2 | 11/2014 | Dent |
| 8,933,320 B2 | 1/2015 | Meyer |
| 8,958,182 B2 | 2/2015 | Luebke et al. |
| 2012/0026631 A1 | 2/2012 | Kazemi et al. |
| 2012/0049627 A1* | 3/2012 | Matsuo ............ H01L 31/02021 307/43 |
| 2013/0222951 A1 | 8/2013 | Zhu et al. |
| 2013/0285670 A1 | 10/2013 | Yoshidomi et al. |

FOREIGN PATENT DOCUMENTS

| | | |
|---|---|---|
| WO | 2013018794 A1 | 2/2013 |
| WO | 2013018795 A1 | 2/2013 |
| WO | 2013018797 A1 | 2/2013 |
| WO | 2013018796 A1 | 3/2015 |

* cited by examiner

GROUND FAULT DETECTION AND INTERRUPT SYSTEM

I. FIELD OF THE INVENTION

The present invention generally relates to fault detection in inverter systems. More particularly, the present invention relates to fault detection and isolation in inverters connected to the electrical grid.

II. BACKGROUND OF THE INVENTION

Inverters, and inverter based systems, are used in a variety of applications. By way of example, inverters are commonly used for converting direct current (DC) output from a photovoltaic (PV) solar array into alternating current (AC). This AC current can be supplied to the electrical grid, or used for other purposes, such as standalone electrical networks. Inverter operability, therefore, can be critical. Inverters, however, can be particularly vulnerable, and rendered inoperable, by a variety of different fault conditions.

When inverters become inoperable, especially when used in PV array energy systems, the result can be lost production, or worse: lost electrical generation. Solar applications inherently include large numbers of PV array circuits connected to a single inverter. These array circuits can have long cable runs (e.g., many kilometers), with many connection points, distributed to PV panels. These long cable runs increase the likelihood of faults, an increase the difficulty of identifying faults when they occur. Faults may also occur internal to the PV panels. Ground faults (e.g., line-to-ground) are among the most common type of faults Given the long cable runs, large numbers of connection points, and the possibility of faults occurring within the PV panels, the chances of a ground fault outside of the inverter can be relatively high. In high power solar applications, the number of PV array circuits increases and the risks associated with downtime increases proportionally. Power inverters are conventionally used in these high power solar applications.

Power inverters typically operate on power circuits that are isolated from ground and sectioned off from other sources and loads. This is typically done when faults are detected to prevent common mode effects of the switching devices from affecting other loads and generation sources. Due to this isolation, a ground fault event can go undetected by other protection devices, such as fuses and circuit breakers, as a single fault will not usually activate these protection devices. Typically, line-to-ground faults are detected using conventional ground fault detection circuits.

These conventional devices, however, provide suboptimal fault tolerance. For example, conventional power inverters typically include a single circuit for detecting a fault on the entire power system without any indication of specifically where the fault is located. On the other hand, larger numbers of inverters can be used to provide more robust fault detection. These larger number of inverters come at considerably increased costs due to the higher number of systems and supporting infrastructure Since the location of the faults cannot be easily determined in conventional systems, continued system operation of these systems, after the occurrence of faults, is nearly impossible.

III. SUMMARY OF THE EMBODIMENTS

Given the aforementioned deficiencies, a need exists for methods of automatic system recovery from faults that can greatly reduce lost electrical power production and increase operational reliability in high power inverter systems.

In certain circumstances, embodiments of the present invention provide a fault isolation apparatus for an inverter configured for coupling to an external power supply. The apparatus includes a plurality of fault detection devices, each configured to (i) complete an electrical path between the inverter and the external power supply and (ii) detect a fault along its respective electrical path. The apparatus also includes a controller configured to instruct the fault detection device to complete its respective electrical path only when the path is devoid of the detected fault.

With higher operational reliability, users can continue operating systems, such as solar PV arrays couple to the electric grid, when faults occur. Such an approach can have significant commercial benefits. By way of example only, and not limitation, in higher power systems, such as PV inverter systems, PV arrays can be partitioned into multiple zones. The partitioning ultimately enables achievement of a substantial percentage (e.g., 75% or more) of operational power after detection of a ground fault in one of the PV arrays. That is, embodiments of the present invention enable the system to gracefully degrade when faults occur, retaining significant levels of operational capability, instead of being rendered completely inoperable.

More specifically, the embodiments minimize the risk of down-time by partitioning the PV array circuits and inverter into zones. Fault monitoring occurs within these individual zones, allowing the system to continue to operate by reconnecting all of the zones where faults have not been detected. Zones where faults have been detected remain disconnected and do not re-enter operation until the faults have been corrected.

Embodiments of the present invention can be particularly beneficial in high power solar applications where multiple MWs of solar arrays can be lost due to a fault in only one solar panel. In some embodiments, a plurality of ground fault detection circuits and disconnect switches are used to determine in which zone(s) the fault has occurred.

During a fault (e.g., a ground fault), all disconnect switches are opened immediately. While open, current sensors monitor current within their zone. If ground current continues to be detected within this zone, the zone is determined to have a ground fault and it ceases to operate. Zones that do not detect a ground current can then be re-connected to the power circuit.

These and other aspects of the present disclosure will become apparent from the following description of the embodiments taken in conjunction with the following drawings and their captions, although variations and modification therein may be affected without departing from the spirit and scope of the novel concepts of the disclosure.

IV. BRIEF DESCRIPTION OF THE DRAWINGS

The present disclosure is illustrated in the accompanying drawings, throughout which, like reference numerals may indicate corresponding or similar parts in the various figures. The drawings are only for purposes of illustrating preferred embodiments and are not to be construed as limiting the invention. Given the following enabling description of the drawings, the novel aspects of the present disclosure should become evident to a person of ordinary skill in the art.

V. DETAILED DESCRIPTION

Figure 1:
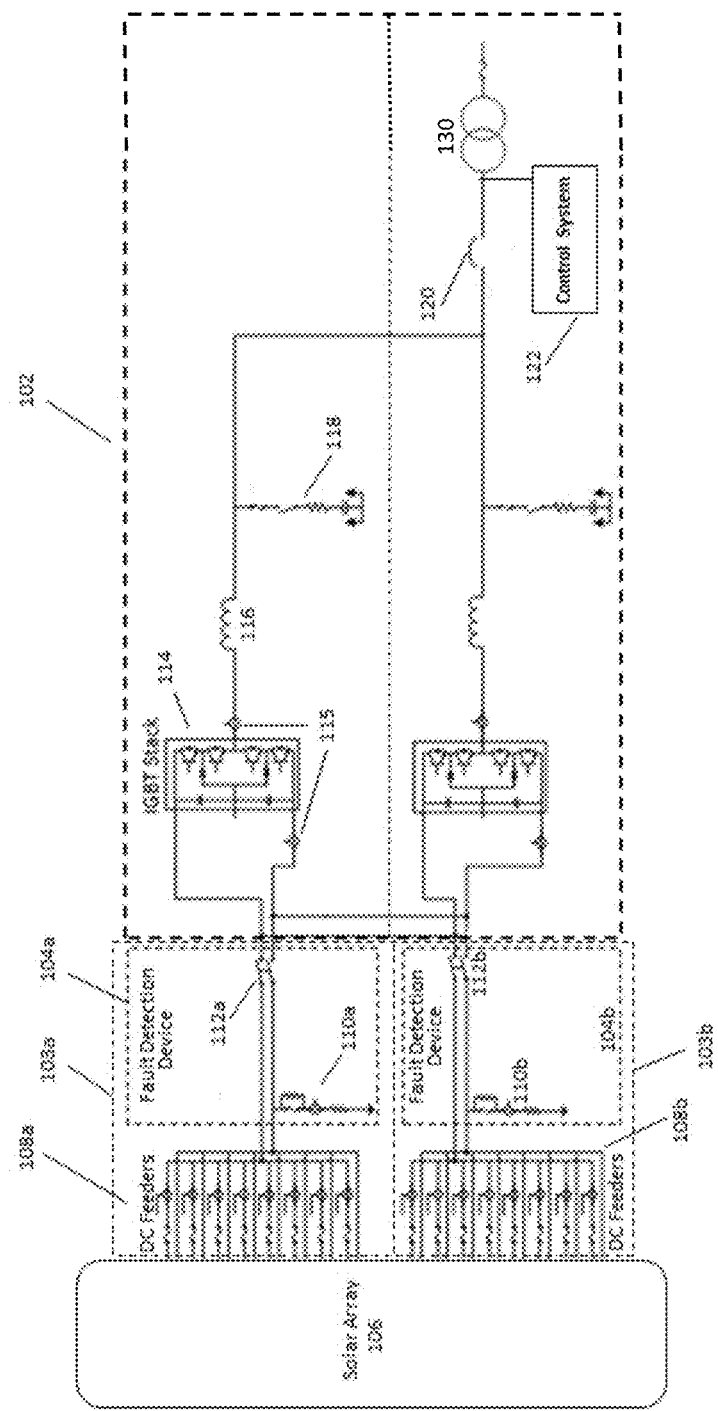
FIG. 1 is a block diagram illustration of an exemplary environment in which embodiments of the present invention can be practiced.

The following description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In the embodiments, users can continue operating systems, such as solar PV arrays couple to the electric grid, even when faults occur. Solar inverters, for example, are typically connected to a high number of solar panels via cabling, and associated circuitry, possibly spanning several kilometers. Embodiments of the present invention reduce the impact that a single fault occurring in one or more of the solar panels, or related circuitry, would have on the operation of the entire inverter.

By way of example only, and not limitation, in higher power PV inverter systems, such as 4 MW solar inverters, PV arrays can be partitioned into multiple zones, including fault detection and switching in each zone. The partitioning enables achievement of reduced operational power after detection of a fault, such as a line to ground fault, in AC or DC circuits associated with the PV arrays.

FIG. 1 is a block diagram illustration of an exemplary solar panel circuit arrangement 100 in which embodiments of the present invention can be practiced. By way of example, and for purposes of illustration, the solar panel circuit arrangement 100 is an inverter system.

The inverter system 100 includes a solar inverter section 102 (i.e., common zone), two partitioned sections (i.e., DC zones) 103a and 103b, including corresponding fault detection devices 104a and 104b. The internal structure and function of DC zones 103a and 103b are identical. Thus, the description below will primarily focus only on zone 103a.

The inverter 102 converts DC current output from a PV solar array 106 into AC for use in downstream applications, such as the electric grid. The solar inverter 102 includes an insulated-gate bipolar transistor (IGBT) inverter stack 114, for optimizing the AC output power provided to the electric grid, along with current sensors 115 for controlling the IGBT stack 114. Line reactor 116 and distortion filter 118 cooperatively smooth and filter the AC power output from the IGBT stack 114, provided to the grid.

The fault detection device 104a detects occurrence of faults and opens related circuits, and circuit breakers, to protect the inverter system 100 when faults are detected. In the illustrious embodiments, each of the partitioned DC zones 103a-103n, and the solar panel circuitry included therein, is sampled for the occurrence of a fault.

The zone 103a also includes DC feeders 108a and fault detection device 104a. Although FIG. 1 depicts only two DC zones 103a and 103b, the present invention is not so limited. The inverter partitioning can produce any suitable number (e.g., 4, 6, 10, 20, etc.) of zones, as understood by a skilled artisan, and as described below.

In the embodiment of FIG. 1, fault detection device 104a includes a fault circuit 110 and a DC switch 112. In the event a fault is detected on any of the circuits associated with the DC Feeders 108a/108b or the solar array 106, the DC switches 112 and circuit breakers, such as circuit breaker 120, are opened to protect the inverter system 100.

All sections of the solar array 106 (depicted in FIG. 3) are monitored to determine the section in which the fault occurred. Each of the partitioned sections is associated with a single fault circuit 110 and DC switch 112. Functions associated with current sensing and fault detection are controlled via a control system (e.g., a programmable computer/microcontroller) 122. By way of example only, and not limitation, the circuit breaker 120 and the control system 122 are coupled to a utility transformer 130.

When the fault's location has been determined, a zone in which it occurred is tagged as inoperable. The DC switches 112 associated with the remaining sections, where the fault did not occur, are opened. These remaining zones remain operable if they are determined to be fault free. Operation of the fault circuit 110, along with the DC switches 112, is fundamental to detecting and compensating for faults.

Figure 2B:
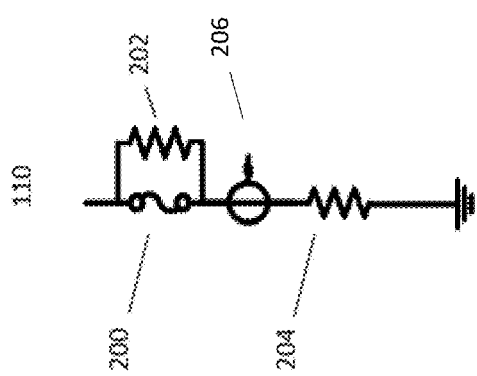
FIG. 2B is a block diagram illustration of an exemplary ground fault circuit constructed in accordance with an alternative embodiment of the present invention.
Figure 2A:
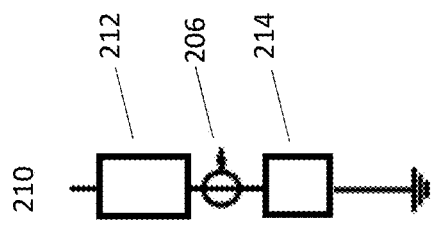
FIG. 2A is a schematic diagram of the exemplary ground fault circuit illustrated in FIG. 1, constructed in accordance with the embodiments.

FIG. 2A is a more detailed illustration of the fault circuit 110 depicted in FIG. 1. Primary operation of the fault circuit 110 focuses on scenarios where the solar array 106 is connected to various sections of the inverter, such as the common zone 102 and the DC zones 103a and 103b. In scenarios where the solar array 106 is disconnected from sections of the inverter 100 via, for example, the DC switch 112 serves as the disconnect mechanism.

In the exemplary embodiment of FIG. 2A, the fault circuit 110 includes a fuse 200 (e.g., a fuse resistor), to protect cabling to the solar array 106 and indicate faults that occur while the inverter 100 is non-operational. Additionally, the fuse 200 opens during high fault currents. By way of example only, these high fault currents can be associated with bolted fault conditions. In some embodiments, the fuse 200 is configured to open when the inverter 100 is off-line. A resistor 202 provides a ground reference in the event the fuse 200 opens during current limiting occurrences.

Another resistor 204 limits fault current by interacting with the fuse 200, to provide an interrupt rating of sufficient amperage. In other embodiments, the resistor 204 creates a current divide function with the resistance of the common DC bus to prevent the fault circuit 110 from being used as a parallel path. A current sensor 206 monitors currents within the fault circuit 110, and in cooperation with the control system 122, throughout remaining portions of its respective DC zone.

The control system 122 includes a central processing unit (CPU) 124, a memory 128, and an input/output (I/O) device 126. The control system 122 controls operation of the fault circuit 110 and other essential components within the solar inverter system 100.

FIG. 2B is a block diagram illustration of an exemplary ground fault circuit 210 constructed in accordance with an alternative embodiment of the present invention. The ground fault circuit 210 includes a sensing device 212. The sensing device 212 can be formed of a combination of discrete, or integrated circuit (IC), components for detecting round faults. In one illustrious embodiment, for example, the sensing device 212 performs the functionality of the fuse 200 and the resistor 202 of FIG. 2A. The ground fault circuit 210 also includes an impedance device 214 that can be implemented via one or more discrete components and or ICs.

Figure 3:
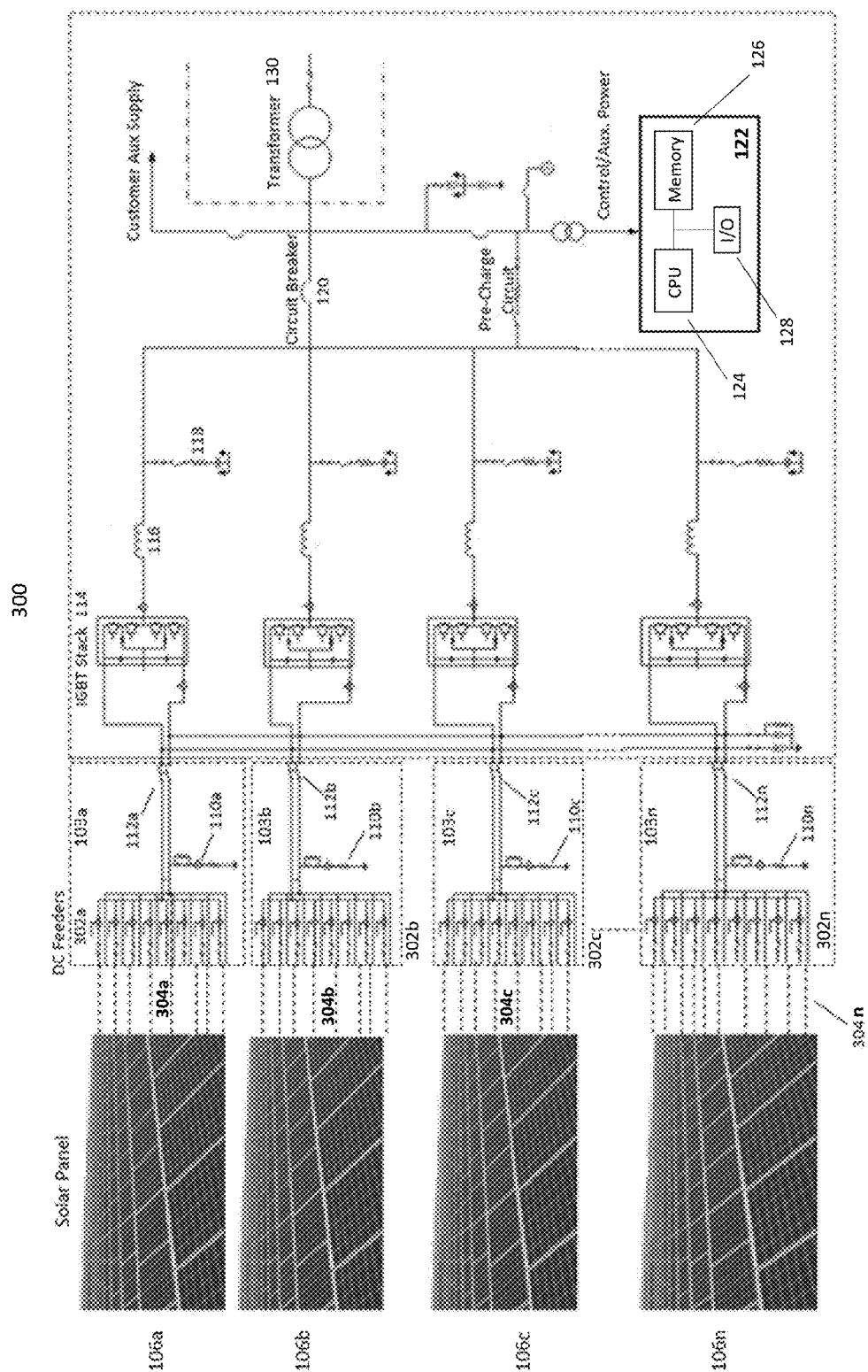
FIG. 3 is a block diagram illustration of a more detailed exemplary environment in which embodiments of the present invention can be practiced.

When the solar inverter system 100 is energized, the control system 122, in conjunction with the fault circuit 110, determines whether a fault exists within one of the zones, or related circuitry. FIG. 3 is an illustration of an exemplary solar inverter 300. The solar inverter 300 provides greater details of the solar inverter 100 of FIG. 1.

In addition to the features described above with reference to FIG. 1, and by way of example, the solar inverter 300 of FIG. 3 depicts at least four zones 103a-103n, each respectively including corresponding fault circuits 110a-110n, along with corresponding DC switches 112a-112n. Each zone is connected to a corresponding solar panel 106a-106n via corresponding cables 304a-304n.

In one exemplary embodiment, current sensing on each of the fault circuits 110a-110n between the fuse 200 and the resistor 204 measures ground fault current. The control system 122 then calculates the sum of the corresponding zone's currents and disconnects the inverter 300. More specifically, the control system 122 disconnects the inverter 300 by disconnecting the circuit breaker 120 and a corresponding one of the DC switches 112a-112n, when the summation exceeds the predetermined current threshold.

In an exemplary embodiment, when the summation exceeds the threshold, the control system 122 checks each of the zones 103a-103n to determine if the respective fuse (e.g., the fuse 200) has been blown, or if a ground current exceeds the current threshold for that zone. If the fuse was blown or if the ground current exceeds the threshold, the corresponding zone is considered tripped, or disconnected. Accordingly, this tripped zone is then configured for manual resetting.

If the fuse was not blown, or the ground current does not exceed the threshold, the active zone is not tripped and remains operational. The control system 122 will test the next one of the DC zones 103a-103n, in a testing sequence, described in greater detail below.

By way of background, the common zone 102 of the inverter system 300 includes circuit components, and circuit segments, that cannot be separated from one another if the system 300 is to remain operational. For example, in the exemplary inverter system 300, if any of the circuit components between the DC switches 112a-112n and the transformer 130, are separated, the remaining components within the common zone 102 become non-operational. Thus, faults that occur within the common zone 102 generally require shutdown of the entire inverter system 300 and intervention by a user.

On the other hand, faults that occur within the DC zones 103a-103n, including the solar panel 106a-106n and the corresponding cables 304a-304n, can be detected within the respective fault circuits 110a-110n.

In the embodiments, since the DC zones 103a-103n are partitioned, ground fault current in each of the zones can be monitored and measured. If current measured in one of the zones 103a-103n exceeds the predetermined current threshold, or if the fuse 200 is blown, the one zone is tagged as faulted and does not reclose automatically.

In one illustrious embodiment, a fault current exceeding the predetermined current threshold in any of the zones 103a-103n can open its respective fuse 200. Once the fuse 200 is open, the fault current passes through the resistor 202. As a result, this fault current is limited to a second threshold (i.e., a fault current threshold).

By way of example, in some embodiments, the fault current threshold can be 30 mA or less. The fuse 200 provides an indication to the control system 122 when it opens. The control system 122 will not re-close the respective DC switch 112a-112n, on any of the zones 103a-103n, when a respective fuse 200 has been blown.

Figure 4:
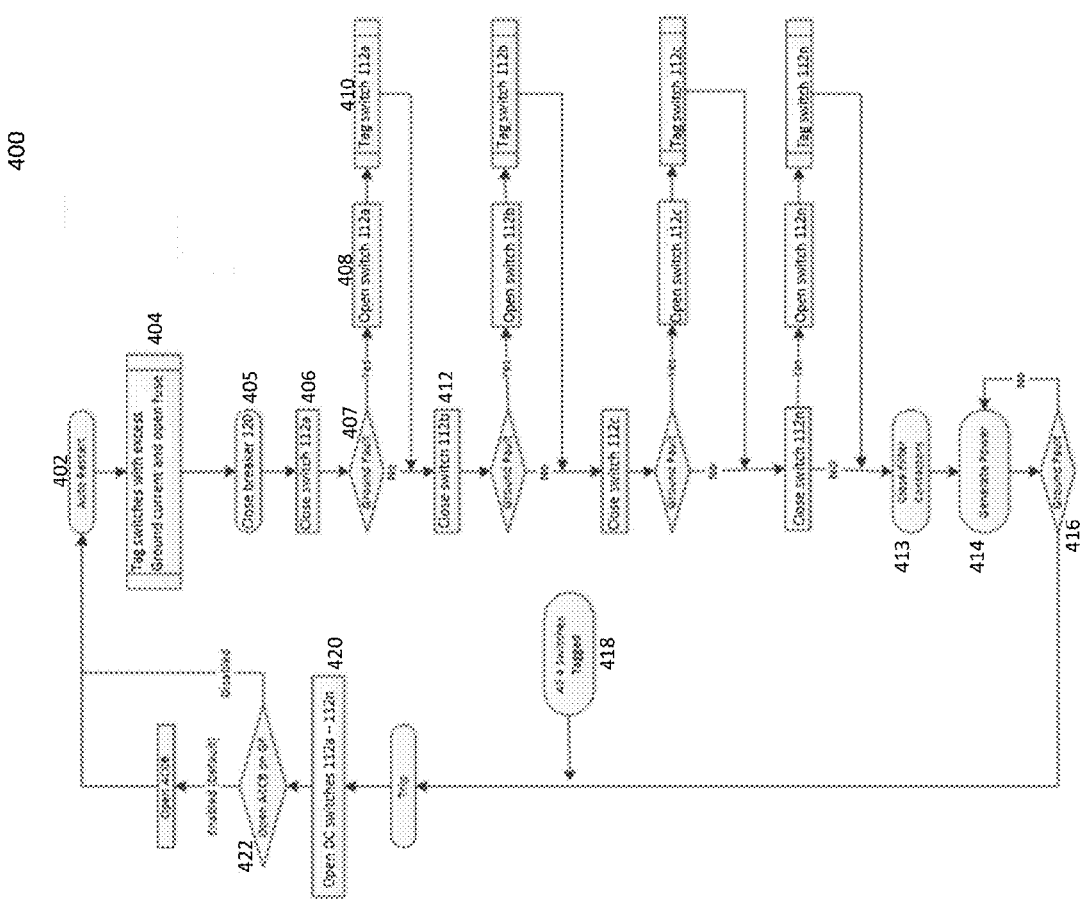
FIG. 4 is a flow diagram of an exemplary method of practicing an embodiment of the present invention.

FIG. 4 is a flow diagram 400 of an exemplary method of practicing an embodiment of the present invention. If disabled, the inverter system will trip upon a ground fault opening all DC switches 112a-112n and the AC breaker 120. The AC breaker 120 can optionally be allowed to remain closed during a ground fault, however that is not the default position. If GFT is enabled, inverter operation is summarized in the flow diagram 400.

In FIG. 4, the fault detection process begins at block 402 with a reset of an inverter system, such as the inverter 300. In step 404, all of the DC switches 112a-112n with access ground current are tagged and the fuses in the respective fault circuits 110a-110n are opened. In a predetermined sequence, beginning in block 405, the AC breaker 120 and the switch 112a are closed. In block 407, if a ground fault is determined, the switch 112a is opened, and tagged in blocks 408 and 410, respectively. Subsequently, or if a ground fault was not detected, the next switching the sequence, the switch 112b is closed in block 412. This process continues until the last switch in the system 300, switch 112n has been tagged.

In block 413, filter contactors, such as the distortion filter 118 of FIG. 1, are closed and power is generated in block 414. In block 416, sampling for a ground fault once again occurs and all switches are tagged if a fault is not detected, in block 418. All of the DC switches 112a-112n in the AC breaker 120 are opened in blocks 420 and 422, respectively.

CONCLUSION

The foregoing description of the exemplary embodiments of the disclosure has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present disclosure pertains without departing from its spirit and scope. For example, multiple probes may be utilized at the same time to practice the present disclosure. Accordingly, the scope of the present disclosure is defined by the appended claims rather than the foregoing description and the exemplary embodiments described therein.

What is claimed is:

1. A fault isolation apparatus for an inverter configured for coupling to an external power supply, the apparatus comprising:

a plurality of fault detection devices, each configured to (i) complete an electrical path between an inverter and an external power supply and (ii) detect a fault along its respective electrical path, and each fault detection device comprising a switch and a detection circuit, the detection circuit comprising a fuse, a current sensor, and a first resistor electrically connected in series, and a second resistor electrically connected in parallel with the fuse; and a controller configured to instruct the fault detection device to complete its respective electrical path only when the path is devoid of the detected fault.

2. The apparatus of claim 1, wherein each of the electrical paths represents a discrete zone.

3. The apparatus of claim 1, wherein the power supply is a photovoltaic (PV) array.

4. The apparatus of claim 1, wherein the fault detection device is configured to measure current values, current values within a predetermined range being representative of a fault.

5. The apparatus of claim 1, wherein the respective electrical path is completed when the switch is closed.

6. The apparatus of claim 1, wherein the fault is a line to ground fault.

7. The apparatus of claim 1, wherein completion of the plurality of electrical paths occurs sequentially.

8. The apparatus of claim 1, wherein completion of the plurality of electrical paths and detection of faults therein, occurs sequentially.

9. A method for isolating faults in a system including an inverter configured for coupling to an external power supply, the method comprising:

detecting electrical conditions along each of a plurality of electrical paths between an inverter and an external power via a corresponding plurality of fault detection devices, each fault detection device comprising a switch and a detection circuit, the detection circuit comprising a fuse, a current sensor, and a first resistor electrically connected in series, and a second resistor electrically connected in parallel with the fuse;

completing each of the plurality of electrical paths via the respective fault detection device;

determining, via a controller, if a detected electrical condition is a fault in the respective electrical paths; and interrupting the respective electrical path if the detected electrical condition is a fault in the path.

10. The method of claim 8, wherein the detecting, completing, and determining a sequentially.

11. The method of claim 8, wherein each of the electrical paths represents a discrete zone.

12. The method of claim 8, wherein the electrical conditions are representative of current values, current values within a predetermined range being indicative of a fault.

13. The method of claim 8, wherein the fault is a line to ground fault.

14. The method of claim 8, wherein the completing includes closing one or more switches.

15. A computer readable media storing computer executable instructions wherein said instructions, when executed, isolate faults in a system including an inverter configured for coupling to an external power supply, with a method comprising:

detecting electrical conditions along each of a plurality of electrical paths between an inverter and an external power via a corresponding plurality of fault detection devices, each fault detection device comprising a switch and a detection circuit, the detection circuit comprising a fuse, a current sensor, and a first resistor electrically connected in series, and a second resistor electrically connected in parallel with the fuse;

completing each of the plurality of electrical paths via the respective fault detection device;

determining, via a controller, if a detected electrical condition is a fault in the respective electrical path; and interrupting the respective electrical path if the detected electrical condition is a fault in the path.

16. The computer readable media of claim 15, wherein the detecting, completing, and determining a sequentially.

17. The computer readable media of claim 15, wherein the electrical conditions are representative of current values, current values within a predetermined range being indicative of a fault.

18. The computer readable media of claim 15, wherein the fault is a line to ground fault.

19. The computer readable media of claim 15, wherein the completing includes closing one or more switches.

* * * * *